United States Patent [19]
Roberts

[11] Patent Number: 5,232,863
[45] Date of Patent: Aug. 3, 1993

[54] METHOD OF FORMING ELECTRICAL CONTACT BETWEEN A FIELD EFFECT TRANSISTOR GATE AND A REMOTE ACTIVE AREA

[75] Inventor: Martin C. Roberts, Boise, Id.

[73] Assignee: Micron Semiconductor, Inc., Boise, Id.

[21] Appl. No.: 963,836

[22] Filed: Oct. 20, 1992

[51] Int. Cl.$^5$ .......................................... H01L 21/266
[52] U.S. Cl. ...................................... 437/40; 437/44; 437/158; 437/162; 437/918
[58] Field of Search .................. 437/40, 41, 44, 54, 437/158, 162, 191, 918; 148/DIG. 31, DIG. 123

[56] References Cited

U.S. PATENT DOCUMENTS

| | | | |
|---|---|---|---|
| 4,581,623 | 4/1986 | Wang | 437/48 |
| 4,786,612 | 11/1988 | Yau et al. | 437/918 |
| 5,064,776 | 11/1991 | Roberts | 437/158 |
| 5,126,285 | 6/1992 | Kosa et al. | 437/162 |
| 5,168,076 | 12/1992 | Godinho et al. | 437/918 |
| 5,187,114 | 2/1993 | Chan et al. | 437/918 |

Primary Examiner—Brian E. Hearn
Assistant Examiner—C. Chaudhari
Attorney, Agent, or Firm—Wells, St. John, Roberts, Gregory & Matkin

[57] ABSTRACT

A method of providing electrical contact between a gate of a transistor device and an active area remote of the transistor device includes: a) providing a first layer of a conductivity capable material over a gate insulative layer; b) etching the first and gate layers to expose a contact area; c) providing a second layer of a second material over the contact area and first layer; d) etching the second layer selectively relative to the first material and the substrate to provide a pair of buried contact spacers over respective opposing edges of the first layer in the contact area, and to reexpose a portion of the contact area and the first layer; e) providing a third layer of a conductivity capable material over the first layer, the buried contact spacers and the exposed portion of the contact area; f) etching the first and third layers to define a transistor gate of one device and a transistor gate of another device, and to interconnect the transistor gate of the another device to the portion of the contact area with the third layer material, and to define an exposed region adjacent both the one gate and one of the buried contact spacers; h) providing insulative spacers about edges of the transistor gates; i) providing a conductivity enhancing impurity implant into the substrate through the exposed region; j) rendering the portion of the contact area within the substrate electrically conductive; and k) rendering substrate beneath the one buried contact spacer electrically conductive to electrically interconnect the portion of the contact area within the substrate to the conductivity enhancing impurity implanted region of the substrate.

30 Claims, 8 Drawing Sheets

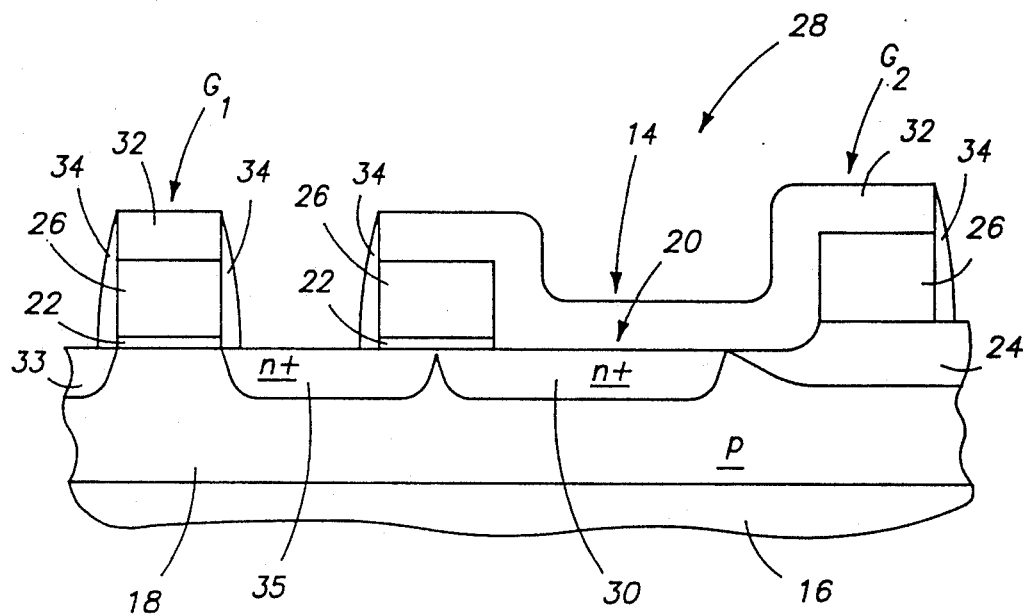
_FIG 5_
_PRIOR ART_
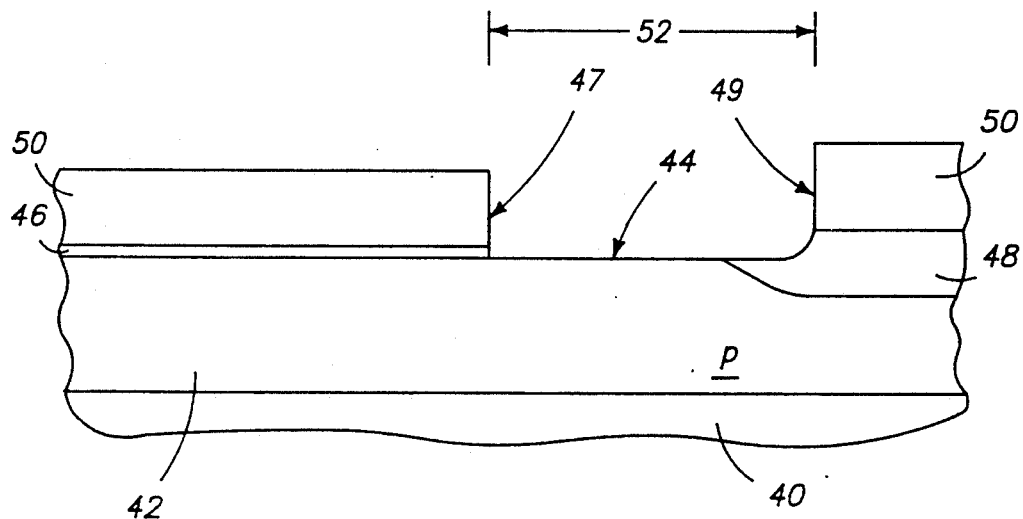
_FIG 6_

METHOD OF FORMING ELECTRICAL CONTACT BETWEEN A FIELD EFFECT TRANSISTOR GATE AND A REMOTE ACTIVE AREA

TECHNICAL FIELD

This invention relates generally to semiconductor integrated circuits, and more specifically to effecting reliable buried contact between the gate of a transistor device and a diffusion area separate from the transistor device. The invention has particular applicability to integrated circuits for use in memory and logic cells, and particularly to SRAM circuitry.

BACKGROUND OF THE INVENTION

The trend in semiconductor integrated circuitry continues to involve a decrease in the size of individual semiconductor structures accompanied by an increase in the complexity and number of such structures aggregated on a single semiconductor integrated chip. Single semiconductor devices have been grouped into integrated circuits, which in turn have been further densified into large scale integrated semiconductor systems. Structure flaws which previously passed unnoticed in individual semiconductor devices and integrated semiconductor circuit systems have become significant, debilitating structural shortcomings in intensely miniaturized, densely packed large scale integration efforts.

In memory cells and in logic cells, for example, it has been common to interconnect the gate of a transistor device through the surface of the semiconductor substrate upon which it is located to various diffusion areas formed in the surface of that substrate at locations remote from the transistor device itself. The problems inherent in accomplishing this objective are numerous. Further, such problems become more prominent as the semiconductor devices involved are rendered in progressively smaller scale and in increasingly densified arrangements with other devices.

An example of a portion of such a typical SRAM memory cell is shown schematically in FIG. 1 by reference numeral 10. Such comprises a pair of transistors $T_1$ and $T_2$. These transistors are each series connected with a respective biasing resistor $R_1$ and $R_2$ between a biased voltage $V+$ and ground. Transistor $T_1$ comprises a source $S_1$, a drain $D_1$, and a gate $G_1$ therebetween for governing current flow through transistor $T_1$. Correspondingly, transistor $T_2$ comprises a source $S_2$, a drain $D_2$, and a gate $G_2$ located therebetween.

It is common in configuring a pair of transistors into a memory cell, such as transistors $T_1$ and $T_2$, to cross-couple the gate of one transistor to the source or drain of the other. Thus, $G_1$ of transistor $T_1$ is coupled through a current path 12 to the diffusion region which functions as the drain $D_2$ of transistor $T_2$. Similarly, gate $G_2$ of transistor $T_2$ is coupled by another current pathway 14 to the diffusion region which functions as the drain $D_1$ of transistor $T_1$.

Examples of prior art methods and problems associated therewith for providing such interconnections are described in the Background and Invention Description sections of my issued U.S. Pat. No. 5,064,776, which is hereby incorporated by reference. Such techniques employ single layer conductive gates and interconnects.

Another prior art method involving multiple layer conductive gates and interconnects is described below with reference to FIGS. 2-5. FIG. 2 illustrates a semiconductor silicon wafer 16 having a p-type conductivity well 18 and an upper substrate surface 20. A gate insulative layer 22 and field oxide regions 24 have been provided, as shown. A first polysilicon layer 26 is deposited, and an etch conducted to produce buried contact 28. A conductivity enhancing impurity doping is conducted to produce an active n+ region 30.

Referring to FIG. 3, a second polysilicon layer 32 is deposited.

Referring to FIG. 4, polysilicon layers 32 and 26, and oxide layer 22 are etched as shown to define gate $G_1$, gate $G_2$ and interconnect 14. A doped diffusion is conducted to generate n+ active areas 33 and 35 for transistor $G_1$. Active areas 30 and 35 are intended to comprise a composite drain $D_1$ of FIG. 1, but are undesirably separated as shown. Such results from a requirement that the photoresist patterning be conducted such that interconnect polysilicon layer 32 extends beyond the left edge of active area region 30, as shown in FIG. 4, to assure its overlapping with oxide material 22 in the event of misalignment. Were such overlap not provided and misalignment occurs, an undesirable trench would be etched into active area 30 during the poly 32 and poly 26 etch. With the overlap as shown, the poly 32 and poly 26 etch will stop on gate oxide 22, thereby assuring no trenching.

Referring to FIG. 5, oxide spacers 34 are provided about gates $G_1$ and gates $G_2$. Heating of the wafer during various processing steps causes n+ implant regions 30 and 35 to desirably migrate inward somewhat. However, the migration may not be sufficient to create a common active area 30 and 35 ($D_1$ is shown in FIG. 1) as is necessary for desired circuit operation.

It would be desirable to overcome these and other problems associated with the prior art in providing electrical contact between a gate of a transistor device and an active area remote of the transistor device.

BRIEF DESCRIPTION OF THE DRAWINGS

Preferred embodiments of the invention are described below with reference to the following accompanying drawings.

FIG. 5 is a sectional view of the semiconductor wafer of FIG. 2 shown at a prior art processing step subsequent to that shown be FIG. 4.

FIG. 6 is a sectional view of a semiconductor wafer processed in accordance with an aspect of the invention.

DETAILED DESCRIPTION OF THE PREFERRED EMBODIMENTS

Figure 1:
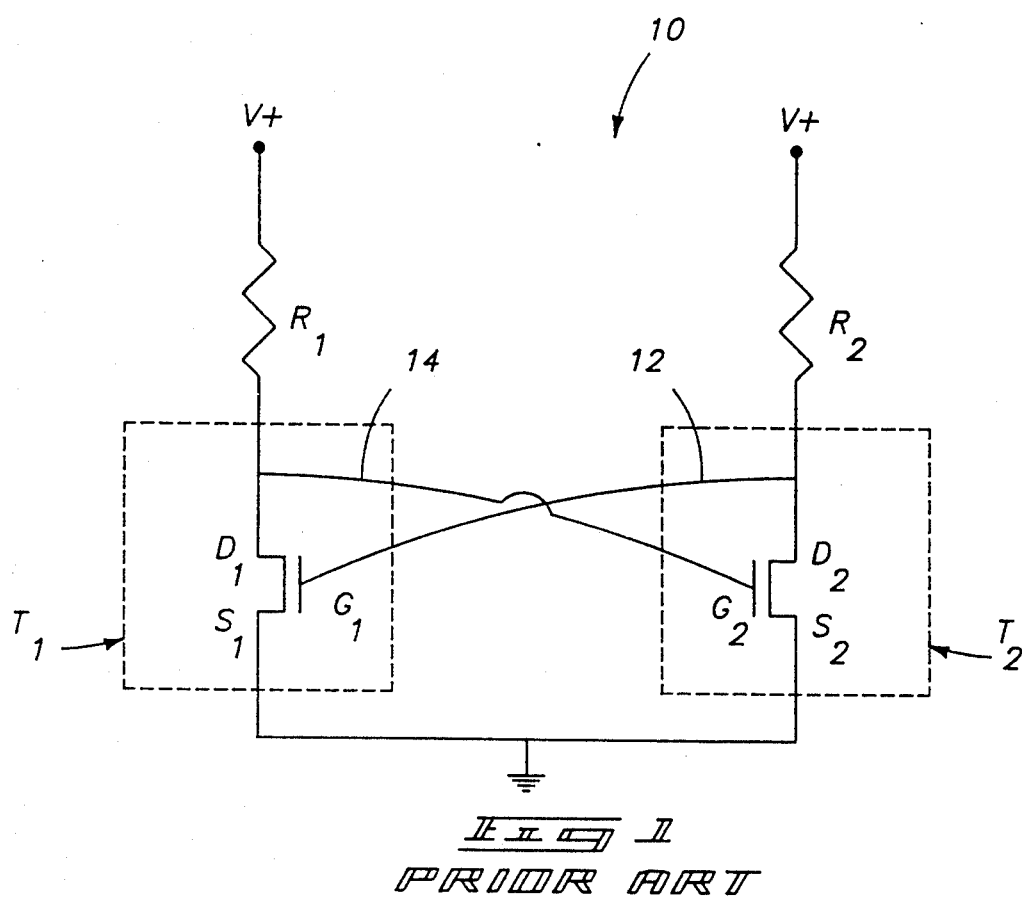
FIG. 1 is a schematic representation of prior art circuitry, and is described above.
Figure 2:
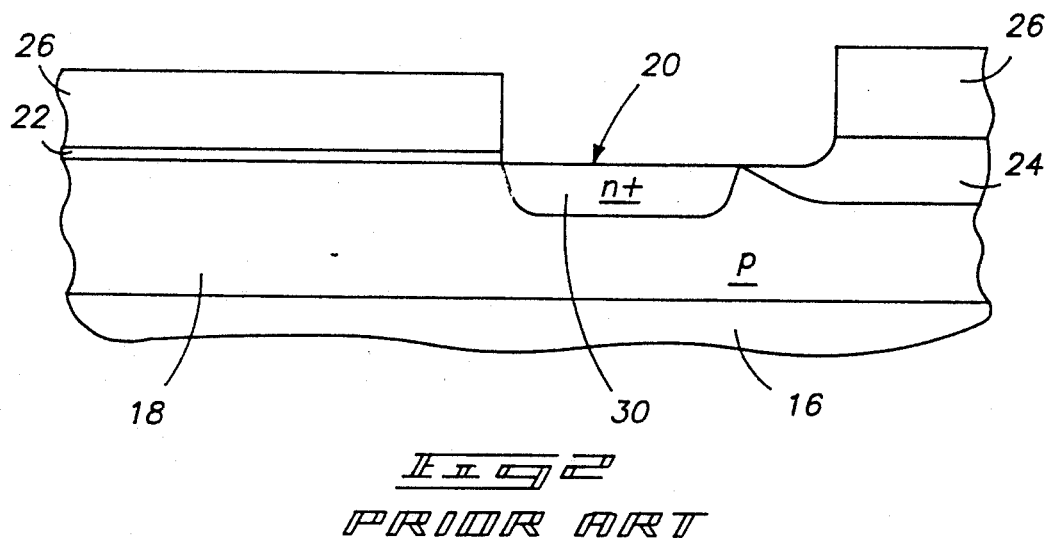
FIG. 2 is a sectional view of a semiconductor wafer process in accordance with prior art methods, and is described above.
Figure 3:
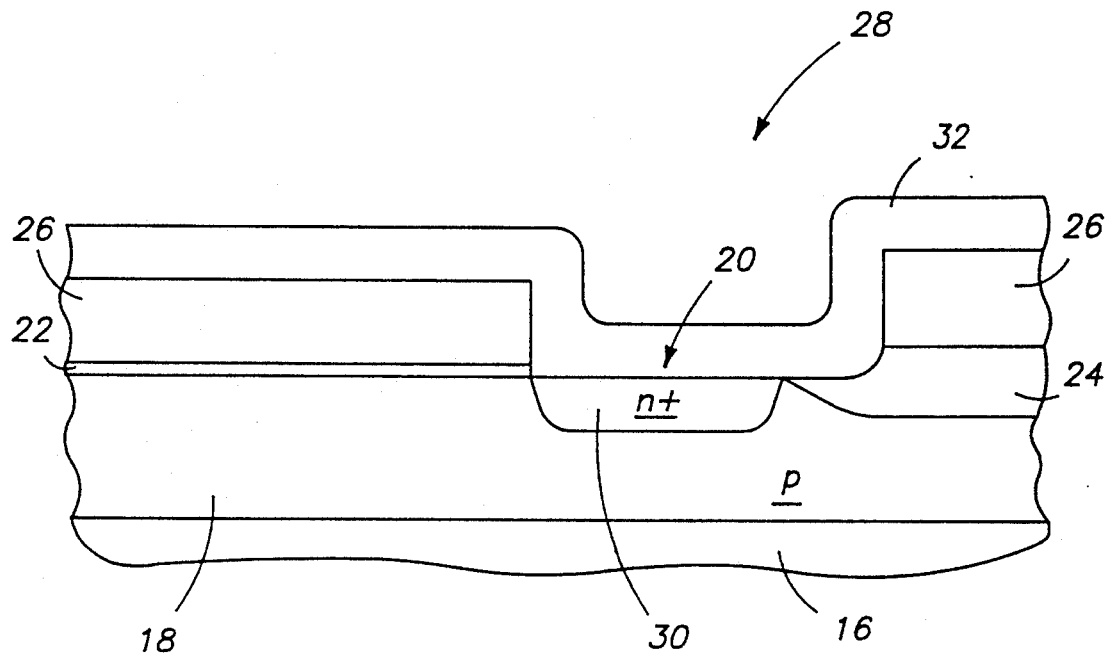
FIG. 3 is a sectional view of the semiconductor wafer of FIG. 2 shown at a prior art processing step subsequent to that shown be FIG. 2.
Figure 4:
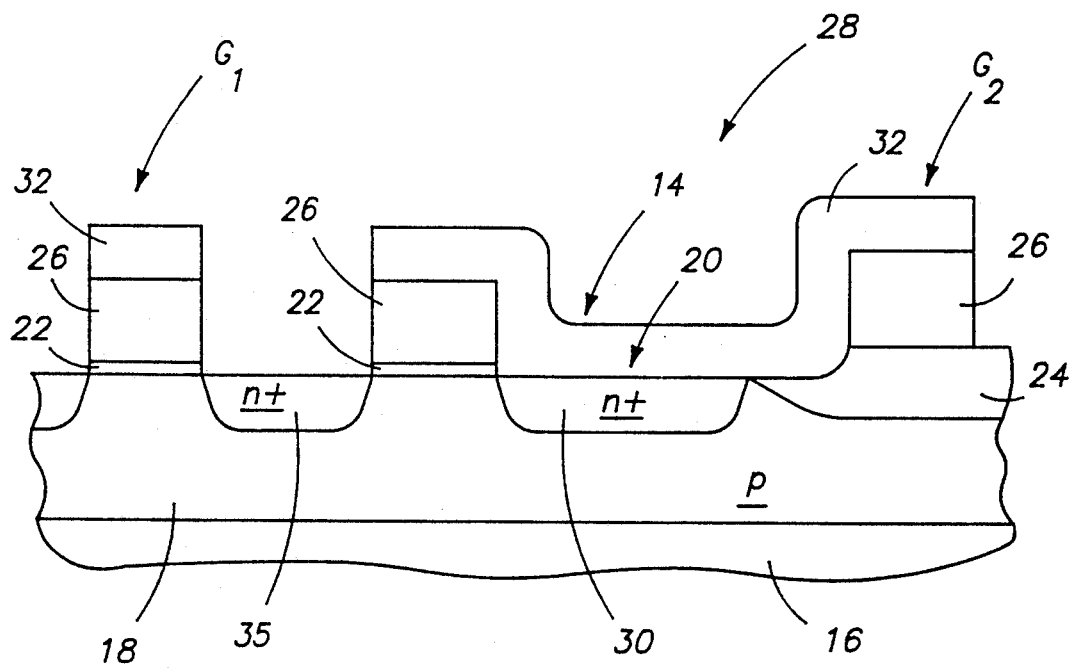
FIG. 4 is a sectional view of the semiconductor wafer of FIG. 2 shown at a prior art processing step subsequent to that shown be FIG. 3.

This disclosure of the invention is submitted in furtherance of the constitutional purposes of the U.S. Patent Laws "to promote the progress of science and useful arts" (Article 1, Section 8).

In accordance with one aspect of the invention, a method of providing electrical contact between a gate of a transistor device and an active area remote of the transistor device comprises the following steps:

providing a gate insulative layer on a semiconductor wafer substrate;

providing a first layer of a first material over the gate insulative layer, the first material being electrically conductive or capable of being rendered electrically conductive;

etching the first layer and gate layer to expose a contact area;

providing a second layer of second material over the contact area and first layer, the second material being selectively etchable relative to the first material and the substrate;

etching the second layer selectively relative to the first material and the substrate to provide a pair of buried contact spacers over respective opposing edges of the first layer in the contact area, and to reexpose a portion of the contact area and the first layer;

providing a third layer of a third material over the first layer, the buried contact spacers and the exposed portion of the contact area, the third material being electrically conductive or capable of being rendered electrically conductive;

etching the first and third layers to define a transistor gate of one device and a transistor gate of another device, and to interconnect the transistor gate of the another device to the portion of the contact area with the third layer material, and to define an exposed region adjacent both the one gate and one of the buried contact spacers;

providing insulative spacers about edges of the transistor gates;

providing a conductivity enhancing impurity implant into the substrate through the exposed region;

rendering the portion of the contact area within the substrate electrically conductive; and rendering substrate beneath the one buried contact spacer electrically conductive to electrically interconnect the portion of the contact area within the substrate to the conductivity enhancing impurity implanted region of the substrate.

In one aspect, the substrate beneath the one buried contact spacer is rendered electrically conductive by having previously doped the second layer with a semiconductor conductivity enhancing material. Such material diffuses from the formed one buried contact spacer into substrate area immediately therebelow to render such substrate area electrically conductive. Such has the effect of electrically interconnecting the portion of the contact area within the substrate to the conductivity enhancing impurity implanted region of the substrate, described above.

In another aspect, the substrate area beneath the one buried contact spacer is rendered electrically conductive by having previously provided a conductivity enhancing impurity into the substrate contact area prior to deposition of the second layer and formation of the buried contact spacers.

Referring first to FIGS. 6–11, a substrate 40 has a p-type conductivity well 42 and a surface 44. A gate insulative layer 46, such as $SiO_2$ is provided, as are field oxide regions 48. A first layer 50 of a first material is provided over gate insulative layer 46. Such first material need be electrically conductive or capable of being rendered electrically conductive, with the preferred material being polysilicon. A preferred thickness for layer 50 is from about 2,000 Angstroms to about 5,000 Angstroms, with about 3,000 Angstroms being most preferred. First layer 50 and gate insulative layer 46, as well as portions of field oxide 48, are etched to expose a buried contact area 52.

Figure 7:
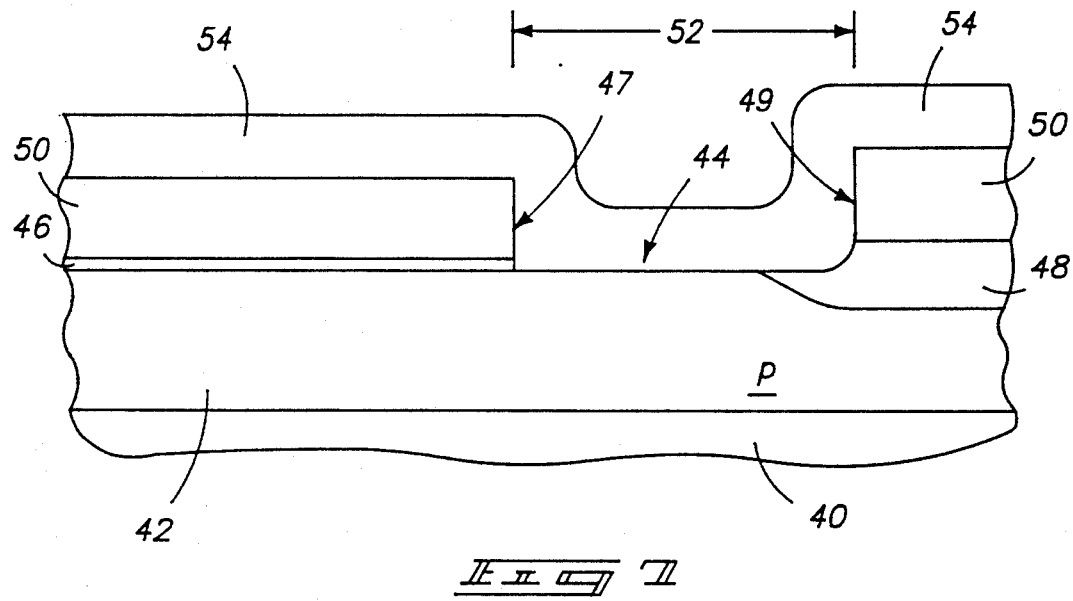
FIG. 7 is a sectional view of the semiconductor wafer of FIG. 6 shown at a processing step subsequent to that shown by FIG. 6.

Referring to FIG. 7, a second layer 54 of a second material is provided over buried contact area 52 and first layer 50. Preferably, the second material of second layer 54 comprises an insulative material, such as an oxide like $SiO_2$, which is in situ doped with a semiconductor conductivity enhancing material of an n-type during such deposition. Example conditions would include the deposition of phosphorus doped oxide using an atmospheric pressure chemical vapor deposition reactor using silane ($SiH_4$), oxygen ($O_2$) and phosphine ($PH_3$) to produce a phosphorus concentration therein of from approximately one-half to two percent, or a dopant concentration of approximately $1 \times 10^{20}$. The thickness of layer 54 is preferably from about 2,000 to about 5,000 Angstroms, with about 3,000 Angstroms being most preferred. For purposes of the continuing discussion, etching of first layer 50 to produce contact opening 52 defines opposing contact opening edges 47 and 49.

Figure 8:
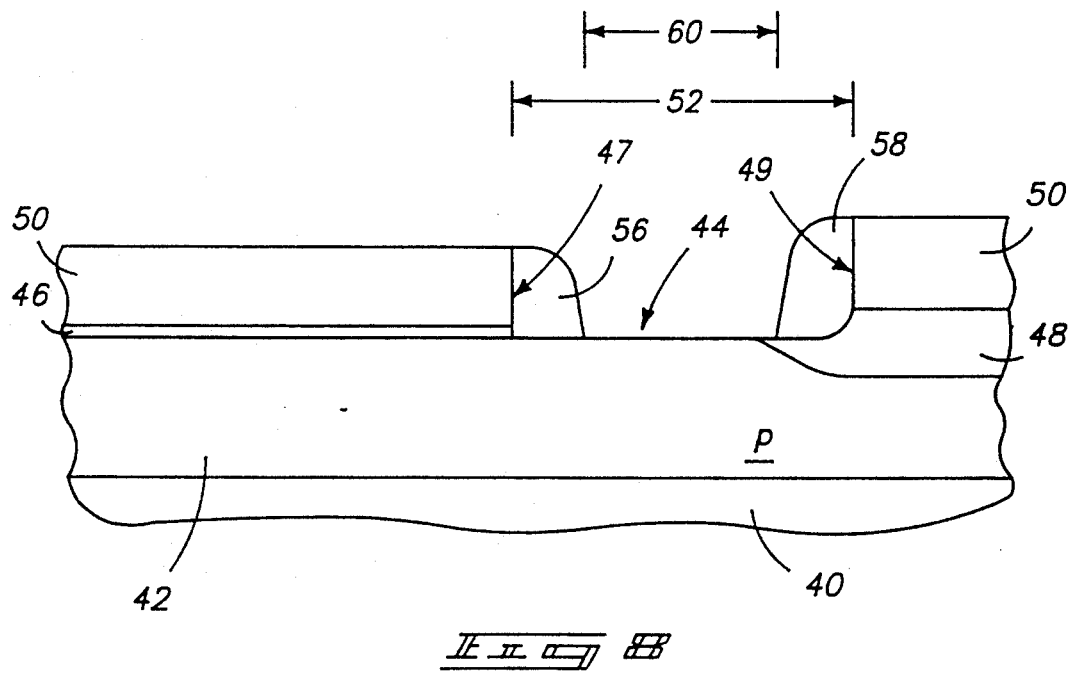
FIG. 8 is a sectional view of the semiconductor wafer of FIG. 6 shown at a processing step subsequent to that shown by FIG. 7.

Referring to FIG. 8, second layer 54 is etched selectively relative to the first material of layer 50 and selectively relative to the silicon substrate to provide a pair of buried contact spacers 56 and 58 over respective opposing edges 47 and 49 of first layer 50 within contact area 52, and to reexpose a portion (designated with numeral 60) of contact area 52, as well as re-upwardly expose first layer 50. Spacers 56 and 58 would have a width at their bases of approximately 2500 Angstroms.

Figure 9:
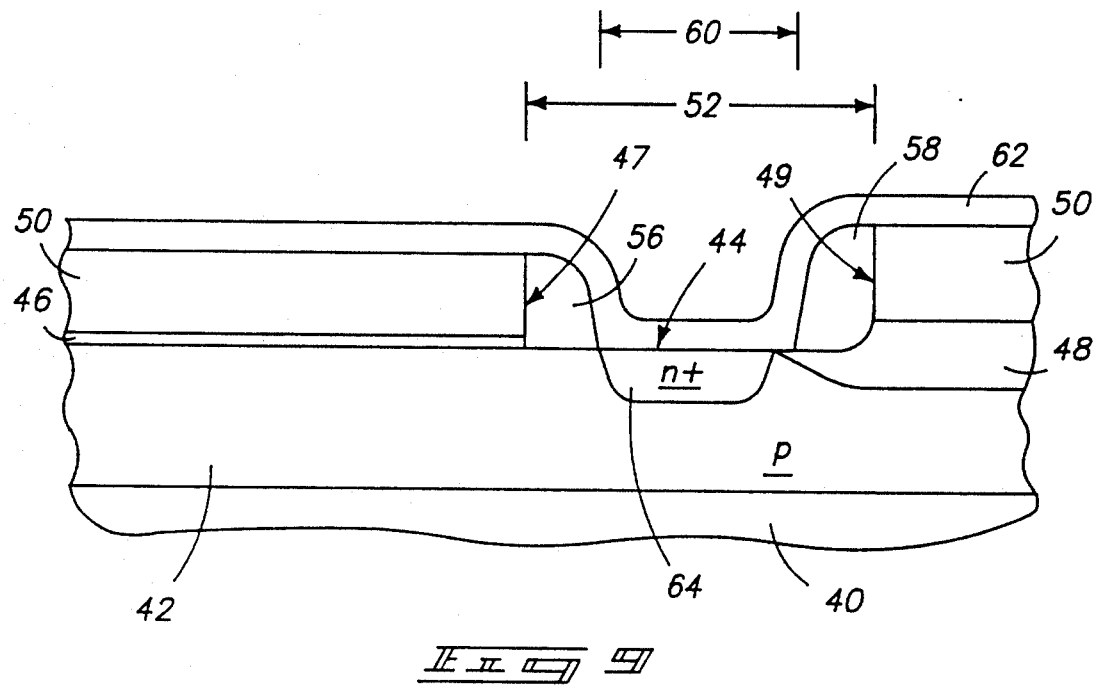
FIG. 9 is a sectional view of the semiconductor wafer of FIG. 6 shown at a processing step subsequent to that shown by FIG. 8.

Referring to FIG. 9, a third layer 62 of a third material is provided over first layer 50, buried contact spacers 56, 58, and exposed portion 60 of contact area 52. The third material need be electrically conductive or capable of being rendered electrically conductive. Preferably, the material of layers 50 and 62 are the same such that these layers can be subsequently etched in a single step, as described below. The preferred third material is polysilicon. The preferred thickness for layer 62 is from about 300 Angstroms to about 1000 Angstroms, with about 500 Angstroms being most preferred. An ion implant is conducted using arsenic as an n+ dopant material to render polysilicon layers 62 and 50 electrically conductive, and to define or render active area portion 60 of contact area 52 within the substrate electrically conductive. Such active area is designated with numeral 64. Of course, layers 50 and 62 when deposited could have been rendered conductive by in situ doping during their respective depositions. In such instances, active area region 64 might be formed as a result of natural dopant diffusion from layer 62 into the substrate. Alternately, an n+ doping/diffusion step could conducted into contact area portion 60 of the FIG. 8 construction.

Figure 10:
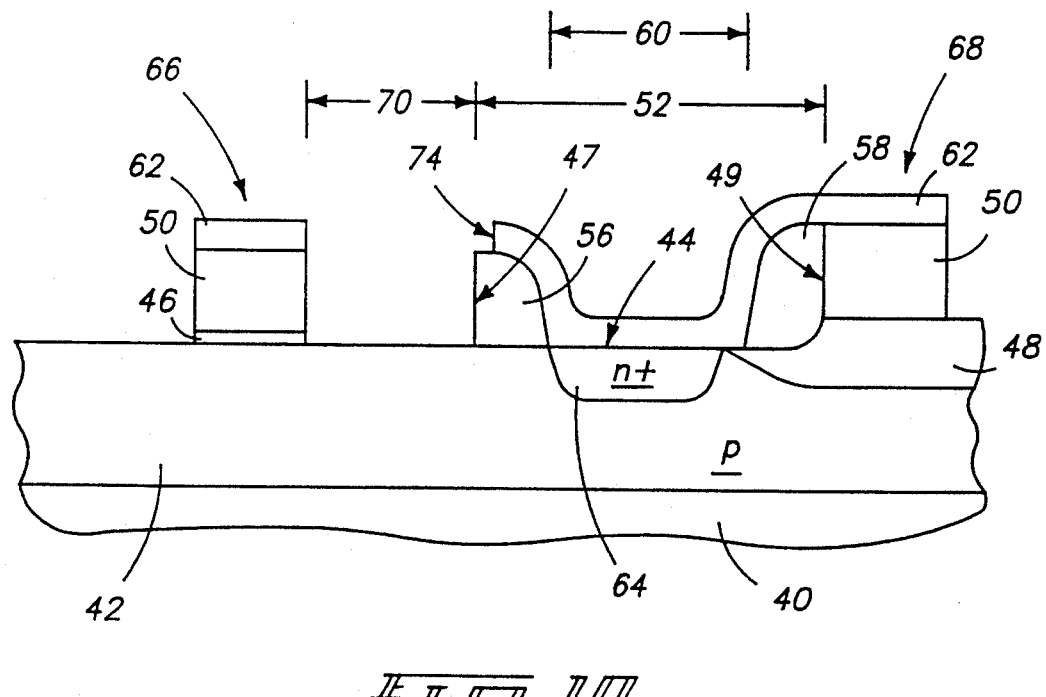
FIG. 10 is a sectional view of the semiconductor wafer of FIG. 6 shown at a processing step subsequent to that shown by FIG. 9.

Referring to FIG. 10, first layer 50, third layer 62 and gate oxide 46 are etched to define a transistor gate 66 of one device and a transistor gate 68 of another device, and to interconnect transistor gate 68 of such another device to portion 60 of buried contact area 52 with the conductive third layer material. Such etching also defines an exposed region 70 adjacent both the one gate 66 and the one buried contact spacer 56, and defines an interconnect edge 74 which terminates above buried contact spacer 56. With layer 62 and 50 comprising the same material, such layers are etched in a single step. Were such layers to comprise different materials, multiple etching steps would most likely be necessary to produce the construction of FIG. 10. Note that is would be satisfactory if mask creation or misalignment occurred such that edge 74 terminated over or within area 70. In such event, the polysilicon etch would stop on the gate oxide, thus preventing trenching into the substrate. FIG. 10 shows both the polysilicon of layers 50 and 62, and gate oxide of layer 46 having been removed. Such would normally be conducted in two distinct etch steps.

Figure 11:
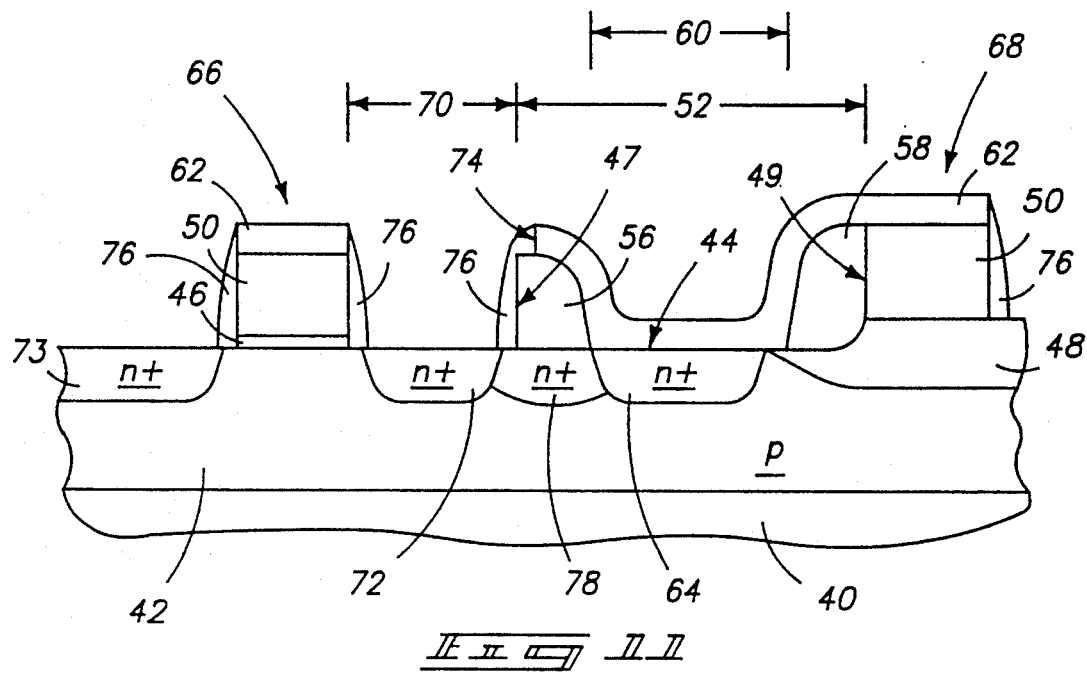
FIG. 11 is a sectional view of the semiconductor wafer of FIG. 6 shown at a processing step subsequent to that shown by FIG. 10.

Referring to FIG. 11, insulative spacers 76 are provided about the edges of transistor gate 66, 68, and about edges 47 and 74. Such can be provided by depositing an oxide layer and subsequently performing an anisotropic etch. An n+ conductivity enhancing impurity implant/doping, such as arsenic at a dose of $5 \times 10^{15}$ and power of 30 KeV, is provided into the substrate through exposed region 70 and other exposed regions, thus defining transistor 66 active area implants 72 and 73. Also, conductivity enhancing material from buried contact spacer 56 is diffused by heating into the substrate area immediately therebeneath to produce an electrically conductive substrate area 78 which electrically interconnects active area 64 and active area 72, to form an essentially common active area within p-type well 42 of the substrate. Example temperature conditions which would be sufficient to drive diffusion dopant atoms from oxide buried contact spacer 56 into the substrate therebeneath include from about 900° C. to about 1000° C. for from about 5 minutes to about 30 minutes. Such would normally occur through the normal processing of the wafer during or after deposition and patterning of spacers 56 and 58 such that a subsequent special diffusion step is not expected to be necessary. Although, the above embodiment is described in such a manner that region 78 is shown formed late in the process, such diffusion into the substrate could and might occur at any point after deposition of second layer 54 which was used to produce spacers 56 and 58.

Figure 12:
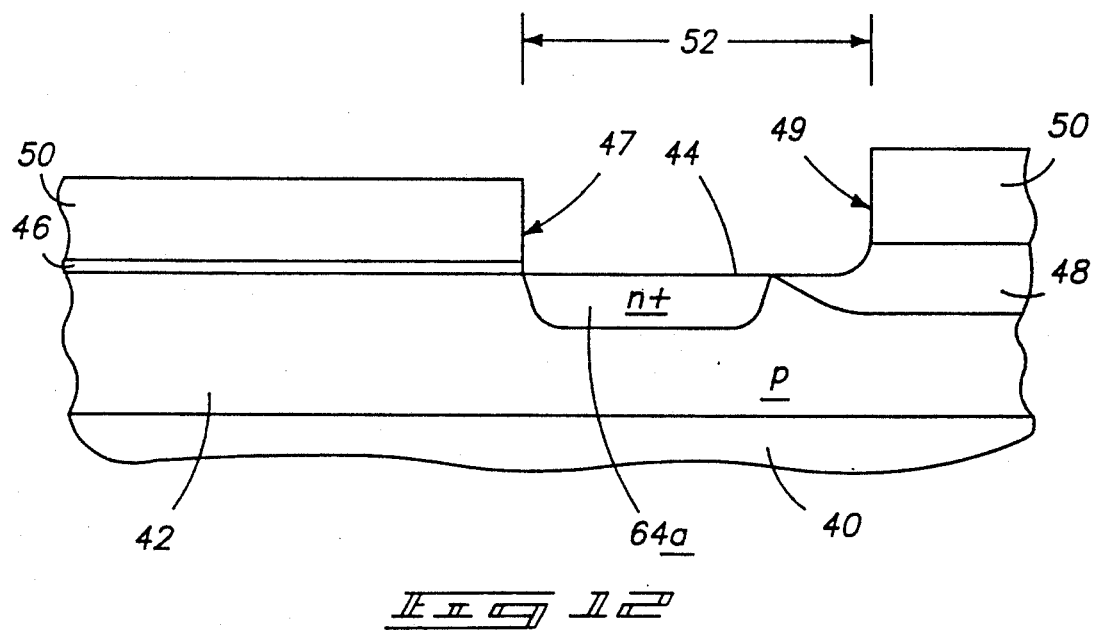
FIG. 12 is a sectional view of a semiconductor wafer processed in accordance with another aspect of the invention.

The discussion proceeds with reference to FIGS. 12-15 regarding an alternate method for rendering substrate area beneath the buried contact spacers electrically active. FIG. 12 takes off from the point of FIG. 6 of the first described embodiment. Like numerals are utilized where possible, with letter suffixes having been added to indicate differences. From the method step shown by FIG. 6 in the first described embodiment, an n+ conductivity enhancing impurity is provided into substrate contact area 52 to produce an active area 64a (FIG. 12).

Figure 13:
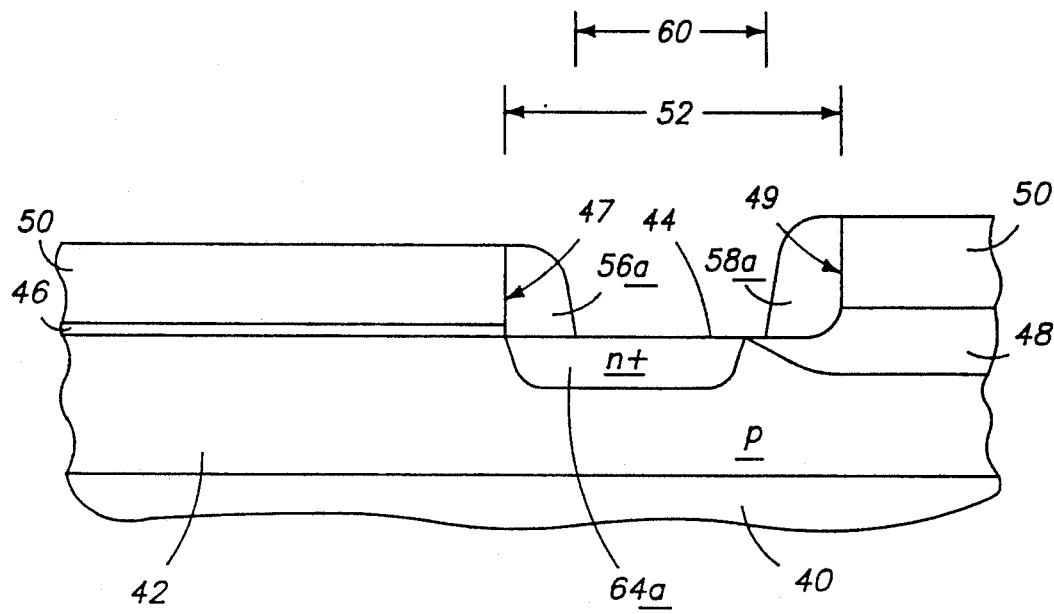
FIG. 13 is a sectional view of the semiconductor wafer of FIG. 12 shown at a processing step subsequent to that shown by FIG. 12.

Referring to FIG. 13, a second layer of second material has been deposited and etched to provide the buried contact spacers 56a, 58a. Note that in accordance with this aspect of the invention, the substrate area beneath the one buried contact spacer 56a has been rendered electrically conductive as a result of the previous conductivity enhancing impurity implant having been provided into the whole of the substrate buried contact area 52. Accordingly, the second layer utilized to produce buried contact spacers 56a and 58a need not have been in situ doped with a conductivity enhancing impurity, as active area was already provided in the area therebeneath prior to deposition of the second layer.

Figure 14:
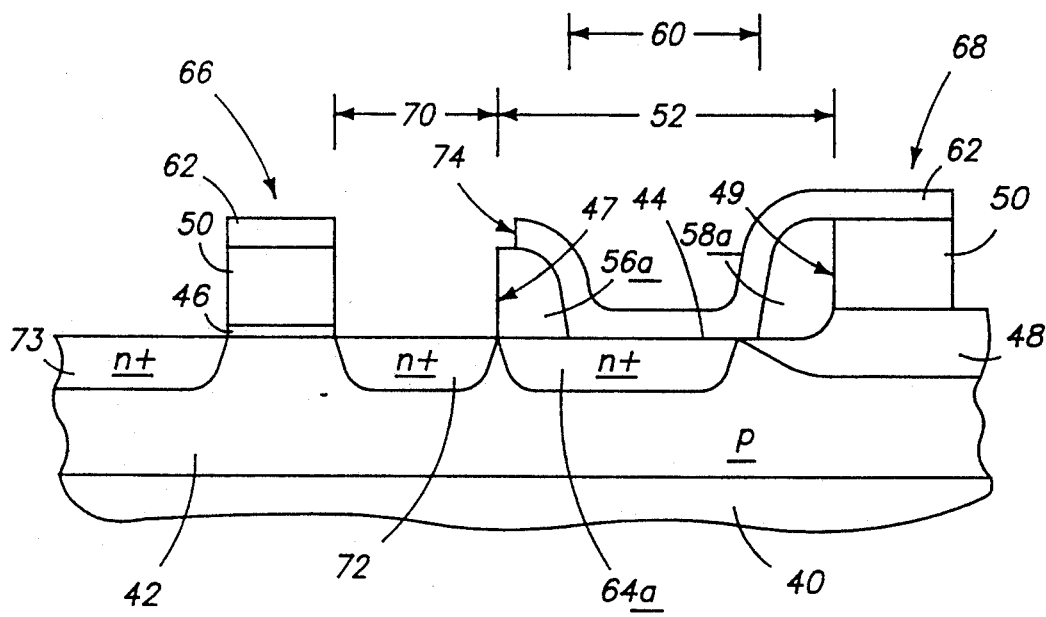
FIG. 14 is a sectional view of the semiconductor wafer of FIG. 12 shown at a processing step subsequent to that shown by FIG. 13.

Referring to FIG. 14, active areas 72 and 73 are formed by impurity diffusion or implantation, with active area 64a abutting adjacent to or adjoining with the formed active area 72.

Figure 15:
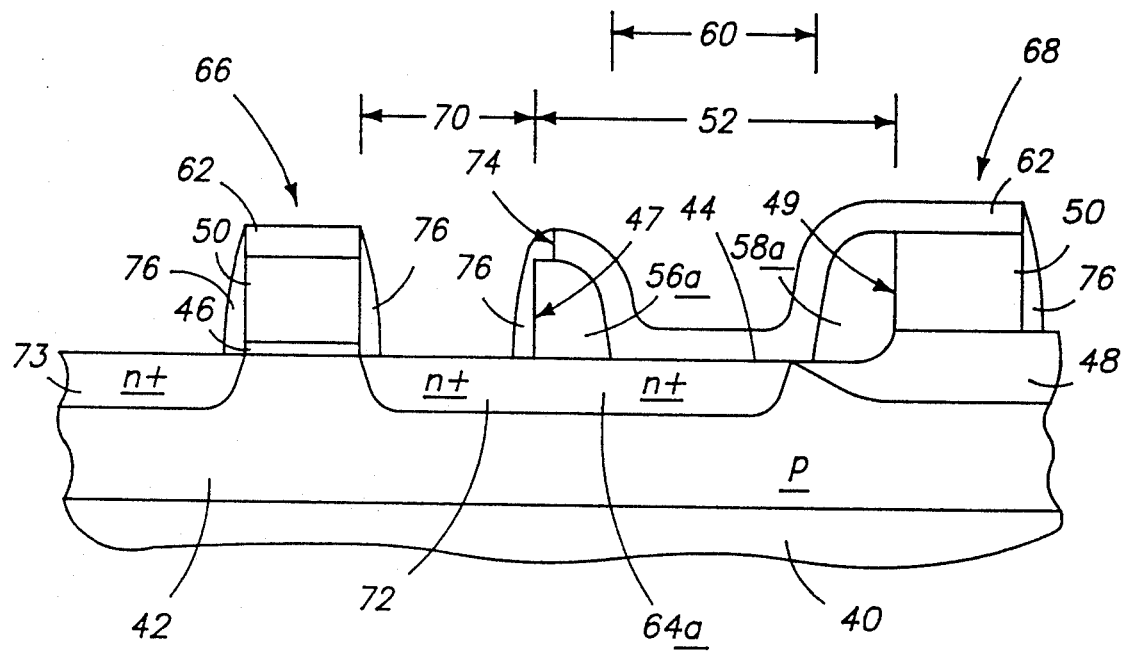
FIG. 15 is a sectional view of the semiconductor wafer of FIG. 12 shown at a processing step subsequent to that shown by FIG. 14.

Referring to FIG. 15, spacers 76 are provided as indicated, and wafer heating in the course of processing in essence produces a fully integrated or common active area joining of regions 72 and 64a. Example temperature conditions which would be sufficient to cause such diffusion/migration would be from about 900° C. to about 1000° C. for from about 5 minutes to about 30 minutes. Again, such is expected to occur from normal wafer processing which would expose the wafer to such conditions. Ion implantation to provide fully-formed active areas 72 and 73 can be provided before or after formation of spacers 76.

In accordance with another aspect of the invention, a novel semiconductor device formed within a semiconductor substrate comprises:

a pair of first and second field effect transistors having respective gates and active areas;

one of the active areas of the first transistor having an overlying buried contact spacer, the buried contact spacer covering only a portion of the one active area; and an electrical interconnect extending from the gate of the second transistor to the one active area, the electrical interconnect overlapping the buried contact spacer.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of providing electrical contact between a gate of a transistor device and an active area remote of the transistor device, the method comprising the following steps:

providing a gate insulative layer on a semiconductor wafer substrate;

providing a first layer of a first material over the gate insulative layer, the first material being electrically conductive or capable of being rendered electrically conductive;

etching the first layer and gate layer to expose a contact area;

providing a second layer of second material over the contact area and first layer, the second material being selectively etchable relative to the first material and the substrate;

etching the second layer selectively relative to the first material and the substrate to provide a pair of buried contact spacers over respective opposing edges of the first layer in the contact area, and to reexpose a portion of the contact area and the first layer;

providing a third layer of a third material over the first layer, the buried contact spacers and the exposed portion of the contact area, the third material being electrically conductive or capable of being rendered electrically conductive;

etching the first and third layers to define a transistor gate of one device and a transistor gate of another device, and to interconnect the transistor gate of the another device to the portion of the contact area with the third layer material, and to define an exposed region adjacent both the one gate and one of the buried contact spacers;

providing insulative spacers about edges of the transistor gates;

providing a conductivity enhancing impurity implant into the substrate through the exposed region;

rendering the portion of the contact area within the substrate electrically conductive; and rendering substrate beneath the one buried contact spacer electrically conductive to electrically interconnect the portion of the contact area within the substrate to the conductivity enhancing impurity implanted region of the substrate.

2. The method of providing electrical contact of claim 1 wherein the etching of the first and third layer comprises etching the third layer to define an interconnect edge which terminates above the one buried contact spacer.

3. The method of providing electrical contact of claim 1 wherein the first material comprises polysilicon.

4. The method of providing electrical contact of claim 1 wherein the third material comprises polysilicon.

5. The method of providing electrical contact of claim 1 wherein the first and third materials comprise polysilicon.

6. The method of providing electrical contact of claim 1 wherein the first and third materials are the same.

7. The method of providing electrical contact of claim 1 wherein the second material comprises an insulative material.

8. The method of providing electrical contact of claim 1 wherein the second material comprises an oxide.

9. The method of providing electrical contact of claim 1 wherein the first and third materials comprise polysilicon, and the second material comprises an oxide.

10. The method of providing electrical contact of claim 1 wherein, the etching of the first and third layer comprises etching the third layer to define an interconnect edge which terminates above the one buried contact spacer;

the first and third materials comprise polysilicon; and the second material comprises an oxide.

11. A method of providing electrical contact between a gate of a transistor device and an active area remote of the transistor device, the method comprising the following steps:

providing a gate insulative layer on a semiconductor wafer substrate;

providing a first layer of a first material over the gate insulative layer, the first material being electrically conductive or capable of being rendered electrically conductive;

etching the first layer and gate layer to expose a contact area;

depositing a second layer of second material over the contact area and first layer, the second material being selectively etchable relative to the first material and the substrate, the second material being in situ doped with a semiconductor conductivity enhancing material during the depositing of the second layer;

etching the second layer selectively relative to the first material and the substrate to provide a pair of buried contact spacers over respective opposing edges of the first layer in the contact area, and to reexpose a portion of the contact area and the first layer;

providing a third layer of a third material over the first layer, the buried contact spacers and the exposed portion of the contact area, the third material being electrically conductive or capable of being rendered electrically conductive;

etching the first and third layers to define a transistor gate of one device and a transistor gate of another device, and to interconnect the transistor gate of the another device to the portion of the contact area with the third layer material, and to define an exposed region adjacent both the one gate and one of the buried contact spacers;

providing insulative spacers about edges of the transistor gates;

providing a conductivity enhancing impurity implant into the substrate through the exposed region;

rendering the portion of the contact area within the substrate electrically conductive; and diffusing conductivity enhancing material from the one buried contact spacer into substrate area immediately therebelow to render such substrate area electrically conductive and to electrically interconnect the portion of the contact area within the substrate to the conductivity enhancing impurity implanted region of the substrate.

12. The method of providing electrical contact of claim 11 wherein the etching of the first and third layer comprises etching the third layer to define an interconnect edge which terminates above the one buried contact spacer.

13. The method of providing electrical contact of claim 11 wherein the first material comprises polysilicon.

14. The method of providing electrical contact of claim 11 wherein the third material comprises polysilicon.

15. The method of providing electrical contact of claim 11 wherein the first and third materials comprise polysilicon.

16. The method of providing electrical contact of claim 11 wherein the first and third materials are the same.

17. The method of providing electrical contact of claim 11 wherein the second material comprises an insulative material.

18. The method of providing electrical contact of claim 11 wherein the second material comprises an oxide.

19. The method of providing electrical contact of claim 11 wherein the first and third materials comprise polysilicon, and the second material comprises an oxide.

20. The method of providing electrical contact of claim 11 wherein,
the etching of the first and third layer comprises etching the third layer to define an interconnect edge which terminates above the one buried contact spacer;
the first and third materials comprise polysilicon; and
the second material comprises an oxide.

21. A method of providing electrical contact between a gate of a transistor device and an active area remote of the transistor device, the method comprising the following steps:
providing a gate insulative layer on a semiconductor wafer substrate;
providing a first layer of a first material over the gate insulative layer, the first material being electrically conductive or capable of being rendered electrically conductive;
etching the first layer and gate layer to expose a contact area;
providing a conductivity enhancing impurity into the substrate contact area;
providing a second layer of second material over the contact area and first layer, the second material being selectively etchable relative to the first material and the substrate;
after providing the conductivity enhancing impurity into the substrate contact area, etching the second layer selectively relative to the first material and the substrate to provide a pair of buried contact spacers over respective opposing edges of the first layer in the contact area, and to reexpose a portion of the contact area and the first layer, the substrate area beneath one of the buried contact spacers being electrically conductive as a result of the previous conductivity enhancing impurity being provided into the whole of the substrate contact area;
providing a third layer of a third material over the first layer, the buried contact spacers and the exposed portion of the contact area, the third material being electrically conductive or capable of being rendered electrically conductive;
etching the first and third layers to define a transistor gate of one device and a transistor gate of another device, and to interconnect the transistor gate of the another device to the portion of the contact area with the third layer material, and to define an exposed region adjacent both the one gate and the one buried contact spacer;
providing insulative spacers about edges of the transistor gates; and
providing a conductivity enhancing impurity implant into the substrate through the exposed region.

22. The method of providing electrical contact of claim 21 wherein the etching of the first and third layer comprises etching the third layer to define an interconnect edge which terminates above the one buried contact spacer.

23. The method of providing electrical contact of claim 21 wherein the first material comprises polysilicon.

24. The method of providing electrical contact of claim 21 wherein the third material comprises polysilicon.

25. The method of providing electrical contact of claim 21 wherein the first and third materials comprise polysilicon.

26. The method of providing electrical contact of claim 21 wherein the first and third materials are the same.

27. The method of providing electrical contact of claim 21 wherein the second material comprises an insulative material.

28. The method of providing electrical contact of claim 21 wherein the second material comprises an oxide.

29. The method of providing electrical contact of claim 21 wherein the first and third materials comprise polysilicon, and the second material comprises an oxide.

30. The method of providing electrical contact of claim 21 wherein,
the etching of the first and third layer comprises etching the third layer to define an interconnect edge which terminates above the one buried contact spacer;
the first and third materials comprise polysilicon; and
the second material comprises an oxide.

* * * * *